(12) United States Patent
Heitmann et al.

(10) Patent No.: US 7,449,739 B2
(45) Date of Patent: Nov. 11, 2008

(54) STORAGE CAPACITOR FOR SEMICONDUCTOR MEMORY CELLS AND METHOD OF MANUFACTURING A STORAGE CAPACITOR

(75) Inventors: Johannes Heitmann, Dresden (DE); Peter Moll, Dresden (DE); Odo Wunnicke, Dresden (DE); Till Schloesser, Dresden (DE)

(73) Assignee: Infineon Technologies AG, Munich (DE)

( * ) Notice: Subject to any disclaimer, the term of this patent is extended or adjusted under 35 U.S.C. 154(b) by 26 days.

(21) Appl. No.: 11/339,744

(22) Filed: Jan. 25, 2006

(65) Prior Publication Data

US 2007/0170487 A1    Jul. 26, 2007

(51) Int. Cl.
*H01L 27/108* (2006.01)
*H01L 29/94* (2006.01)

(52) U.S. Cl. ............... 257/296; 257/306; 257/307; 257/308; 257/309; 257/E27.086; 257/E27.089

(58) Field of Classification Search .......... 257/296, 257/306–309, E27.086, E27.089
See application file for complete search history.

(56) References Cited

U.S. PATENT DOCUMENTS

| 2003/0122174 A1* | 7/2003 | Fukuzumi .............. 257/306 |
| 2004/0217406 A1 | 11/2004 | Chung et al. |
| 2005/0087789 A1 | 4/2005 | Baik et al. |
| 2006/0079049 A1* | 4/2006 | Kundalgurki et al. ....... 438/243 |

* cited by examiner

*Primary Examiner*—Minh-Loan Tran
*Assistant Examiner*—Leslie Pilar Cruz
(74) *Attorney, Agent, or Firm*—Dicke, Billig & Czaja, PLLC

(57) ABSTRACT

A capacitor for a dynamic semiconductor memory cell, a memory and method of making a memory is disclosed. In one embodiment, a storage electrode of the capacitor has a pad-shaped lower section and a cup-shaped upper section, which is placed on top of the lower section. A lower section of a backside electrode encloses the pad-shaped section of the storage electrode. An upper section of the backside electrode is enclosed by the cup-shaped upper section of the storage electrode. A first capacitor dielectric separates the lower sections of the backside and the storage electrodes. A second capacitor dielectric separates the upper sections of the backside and the storage electrodes. The electrode area of the capacitor is enlarged while the requirements for the deposition of the capacitor dielectric are relaxed. Aspect ratios for deposition and etching processes are reduced.

20 Claims, 8 Drawing Sheets

STORAGE CAPACITOR FOR SEMICONDUCTOR MEMORY CELLS AND METHOD OF MANUFACTURING A STORAGE CAPACITOR

FIELD OF THE INVENTION

The present invention relates to a storage capacitor for dynamic semiconductor memory cells and to a method of manufacturing a storage capacitor for dynamic semiconductor memory cells.

BACKGROUND

A dynamic semiconductor memory cell as used in DRAMs (dynamic random access memories) comprises a storage capacitor for storing data and an access transistor for accessing the data stored in the storage device.

Data is stored by charging or discharging the storage capacitor. In stacked capacitor type memory cells the capacitors are formed in a mold layer that covers a substrate surface of a semiconductor substrate.

Within the semiconductor substrate and adjacent to the substrate surface a field effect transistor (FET) is formed as access transistor. In a bit line sensing scheme the access transistor connects a storage electrode of the storage capacitor to a bit line when the cell is addressed.

During a write operation the storage electrode of the storage capacitor is loaded or unloaded according to the potential of the bit line. During a read operation the charge of the storage electrode is transferred to the bit line via the access transistor.

A capacitor dielectric separates the storage electrode and a backside electrode that acts as counter electrode. The backside electrode is connected to a fixed potential. In an array with a plurality of dynamic semiconductor memory cells the backside electrodes of the storage capacitors are connected to each other and form a cell plate.

Due to leakage phenomena charge flows from or to the storage electrode even if the memory cell is not addressed. Refresh cycles are required therefore for to recharge the storage capacitor and for to restore the data being stored therein. Increasing the amount of charge that may be stored in the capacitor may reduce the number of refresh cycles. Thus a larger surface area of the capacitor electrodes is required.

To achieve high packaging densities in a semiconductor memory circuit, the area being occupied by the projection of the storage capacitor on the planar semiconductor substrate surface should not be greater than the area that is occupied by the access transistor on the semiconductor substrate surface.

Increasing the height of the capacitor electrodes above the substrate surface enlarges the effective surface area of the capacitor electrodes. With decreasing design rules and smaller transistor areas, the height of the capacitor electrode increases.

In U.S. Patent Application Pub. No. 2005/0087789 A1, the disclosure of which is incorporated herein by reference, a storage capacitor for a dynamic semiconductor memory cell is described.

According to a first embodiment disclosed in the above document, the storage electrode of the storage capacitor is pad-shaped and forms a solid (not hollow) cylinder. The capacitor dielectric covers the solid pad-shaped storage electrode. The backside electrode covers the capacitor dielectric.

According to a second embodiment disclosed in the above document, the storage capacitor has a double-sided cup-shaped storage electrode. The cup-shaped storage electrode forms a hollow cylinder. The hollow cylinder is closed at the bottom end, which connects the storage electrode to a conducting structure in the adjacent substrate. The hollow cylinder is open at the other end. A capacitor dielectric covers both the inner and the outer vertical sidewalls of the hollow cylinder. The backside electrode covers the capacitor dielectric.

Both the pad-shaped storage electrode and the double-sided, cup-shaped storage electrode concept suffer from the occurrence of sticking or leaning during processing. The surface tension of etching and rinse fluids may cause the storage electrode to lean or to collapse. Leaning storage electrodes may result in electrical short circuits between neighboring memory cells.

According to a single-sided cup-shaped storage electrode concept, the storage electrode is formed exclusively on the inner sidewall and on the bottom portion of an opening in a mold layer. The capacitor dielectric covers the storage electrode. The backside electrode covers the capacitor dielectric within the opening of the mold layer and the surface of the mold layer. Contrary to the above discussed double-sided cup-shaped storage electrode type, the single-sided storage electrode is embedded in a mold layer during each process step of fabrication. Therefore, the single-sided cup-shaped storage electrode does not suffer from sticking and leaning problems.

For a ground area of the storage electrode of about 100 nm$^2$ a height of the storage electrode of more than 4 µm may be required. Then, during formation of the storage capacitor, an opening has to be formed with an aspect ratio of depth to width of more than 100 to 1.

In U.S. patent application Ser. No. 11/039,740, the disclosure of which is incorporated herein by reference, a method is disclosed according to which two or more storage capacitors with pad-shaped storage electrodes are stacked on each other. The storage capacitors are formed successively, such that the pad-shaped storage electrode of the respective upper storage capacitor adjoins the pad-shaped storage electrode of the respective lower storage capacitor. The backside electrodes are connected to each other by means of a contact structure, such that the two or more stacked capacitors form a single capacitor. The maximum height of the resulting single capacitor is decoupled from the aspect ratios that occur during processing.

Further with smaller ground rules and ground area, the aspect ratio for the deposition of the last layer (i.e., the backside electrode material) increases significantly.

U.S. Patent Application Pub. No. US 2004/0217406 A1, the disclosure of which is incorporated herein by reference, refers to a storage electrode comprising a pad-shaped lower section and a cup-shaped upper section for to increase capacitance while reducing the occurrence of close contacts and leaning of the storage electrodes. Even if the cup-shaped upper section is perfectly aligned to the pad-shaped lower section, an edge or step results at the interface of the upper section and the lower section on the outer sidewall of the storage electrode. Then a problem occurs when high-k materials (e.g., HfSiOx or HfAlO) are used as capacitor dielectric. Increasing the deposition temperature enhances the electric properties of the layer of the high-k material but deteriorates the step coverage performance of the layer.

For these and other reasons there is a need for the present invention.

SUMMARY

The present invention provides a storage capacitor for semiconductor memory cells, and method of manufacturing.

In one embodiment, the invention provides a capacitor for a dynamic semiconductor memory cell. A storage electrode of the capacitor has a pad-shaped lower section and a cup-shaped upper section, which is placed on top of the lower section. A lower section of a backside electrode encloses the pad-shaped section of the storage electrode. An upper section of the backside electrode is enclosed by the cup-shaped upper section of the storage electrode. A first capacitor dielectric separates the lower sections of the backside and the storage electrodes. A second capacitor dielectric separates the upper sections of the backside and the storage electrodes.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
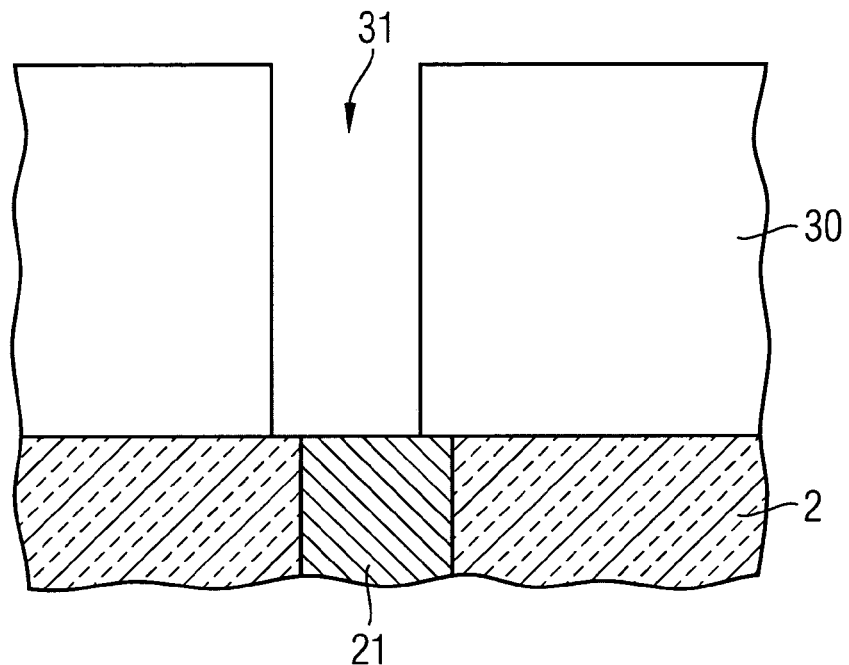
FIGS. 1-8 illustrate a method of making storage capacitors by means of cross sectional views of a semiconductor substrate being processed in accordance with a first embodiment of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a storage capacitor for dynamic memory cells that makes feasible the formation of high aspect ratio storage electrodes and that makes feasible the deposition of a high-k capacitor dielectric with good electrical properties.

According to one embodiment, the present invention provides a capacitor for a dynamic semiconductor memory cell. The capacitor includes a storage electrode. The storage electrode includes a pad-shaped lower storage electrode section and a cup-shaped upper storage electrode section. The upper storage electrode section is placed on top of the lower storage electrode section. The capacitor further includes a backside electrode. The backside electrode includes a lower backside electrode section and an upper backside electrode section. The capacitor includes further a first capacitor dielectric separating the lower storage electrode section and the lower backside electrode section and a second capacitor dielectric separating the upper storage electrode section and the upper backside electrode section. The lower backside electrode section forms a hollow cylinder enclosing the lower storage electrode section. The upper backside electrode section is located within the cup-shaped upper storage electrode section.

Thus, the storage electrode separates the first capacitor dielectric and the second capacitor dielectric. As the first and the second capacitor dielectric are formed independently, no step coverage issue occurs during deposition of the capacitor dielectric. Both high aspect ratio electrode structures and good electrical properties of a high capacitor dielectric layer may be achieved.

According to another embodiment, the present invention provides a method of making a capacitor according to the first embodiment of the invention. For to provide the storage electrode, the backside electrode, the first capacitor dielectric and the second capacitor dielectric of the capacitor, the pad-shaped lower storage electrode section is formed on a horizontal substrate surface of a semiconductor substrate. The pad-shaped lower storage electrode section has essentially vertical sidewalls. The first capacitor dielectric is disposed on the vertical sidewalls of the lower storage electrode section. The lower backside electrode section is disposed on the first capacitor dielectric. A lower mold layer is provided on the lower backside electrode section and on the substrate, such that an upper edge of the lower mold layer is flush with an upper edge of the lower storage electrode section. An upper mold layer is deposited on the lower mold layer and on the lower storage electrode section. An opening is formed in the upper mold layer. The opening exposes a portion of the lower storage electrode section. The lower backside electrode section remains masked. The upper storage electrode section is disposed on the upper mold layer. The upper storage electrode section lines the opening. The second capacitor dielectric is disposed on the upper storage electrode section. The upper backside electrode section is disposed on the second capacitor dielectric. A backside connection structure is formed, which connects the upper backside electrode section and the lower backside electrode section.

Thus a method of making a storage capacitor for dynamic semiconductor memories is provided that makes feasible high aspect electrode structures and that at the same time avoids high aspect etching processes and high aspect deposition processes. Further, as the capacitor dielectric for the lower and the upper section of the capacitor are formed in independent, successive processes, a deposition of the capacitor dielectric over a step at an interface between the lower and the upper capacitor section is advantageously omitted. High-k materials being deposited at high deposition temperatures and having good electrical properties but poor step coverage performance may therefore be used as capacitor dielectric.

Referring to FIGS. 1-8, a process of fabricating a storage capacitor for a dynamic semiconductor memory cell are illustrated by means of cross-sectional views.

An interlayer dielectric 2 covers a semiconductor substrate (not illustrated). Interlayer dielectric 2 is made of an insulator material, for example silicon nitride $Si_3N_4$. A node pad 21 is embedded in interlayer dielectric 2. The upper edge of node pad 21 is flush with the upper edge of interlayer dielectric 2.

Node pad 21 adjoins a conductive structure (not shown), for example a source/drain region of a field effect transistor (FET) that is formed within the semiconductor substrate. Node pad 21 is made of a conductive material, such as doped polycrystalline silicon (polysilicon), a metal or a conductive metal compound. The cross-section of node pad 21 may be circular or oval with a diameter of about 50-150 nanometers or less.

Referring to FIG. 1, a sacrificial mold layer 30 is deposited on interlayer dielectric 2. The material of the sacrificial mold layer 30 is preferable doped silicon oxide. The thickness of sacrificial mold layer 30 may range from 1000 to 4000 Nanometers. An opening 31 is formed within sacrificial mold layer 30 by means of a photolithographic process.

Figure 2:
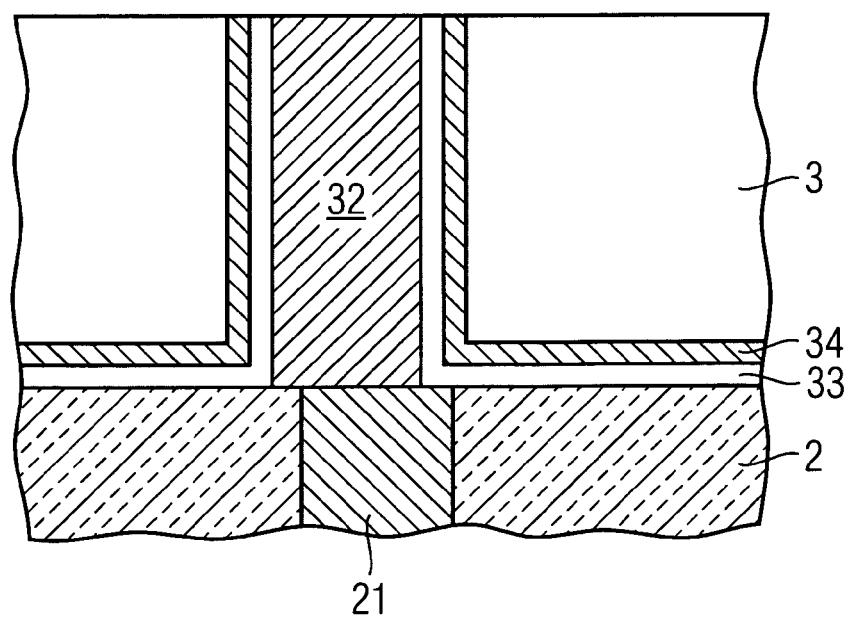

FIG. 2 illustrates opening 31 in the sacrificial mold layer 30. Opening 31 has a diameter equivalent to that of node pad 21 and exposes at least sections of node pad 21, which is embedded in interlayer dielectric 2.

A conductive material is deposited, wherein opening 31 is filled with the conductive material. The conductive material may be polysilicon, a metal or a conductive metal compound. A chemical mechanical polishing process may be performed to remove portions of the conductive material being deposited outside opening 31. Then sacrificial mold layer 30 is removed. The residual conductive material forms a solid, not hollow cylinder adjacent to node pad 21.

Alternatively, the conductive material may be deposited as a layer on interlayer dielectric 2, wherein the layer may be patterned by lithographic means such that a solid, not hollow cylinder is formed on top of node pad 21.

In each case, the solid cylinder forms a pad-shaped lower section of a storage electrode 32.

An insulator material is deposited. The deposited insulator material covers the lower section of storage electrode 32 and interlayer dielectric 2. The insulator material may be a high-k material, for example HfSiOx or HfAlO. The insulator material may be deposited by means of an atomic layer deposition (ALD) process in a thickness that ranges from 8 to 15 Nanometers.

A conformal conductive layer is deposited on the deposited insulator material with a thickness of about 2 to 20 Nanometers. The material of the conductive layer is polysilicon, metal or a conductive metal compound. In one embodiment, the material of the conductive layer is titanium nitride TiN.

A further insulator material is deposited. In one embodiment, the further insulator material is doped or not doped silicon oxide.

The conformal insulator layer, the conductive layer and the deposited oxide are polished and recessed to the upper edge of lower storage electrode section 32, in one embodiment, by chemical mechanical polishing.

FIG. 2 illustrates the recessed insulator layer that forms a first capacitor dielectric 33, the recessed conductive layer that forms a lower backside electrode section 34 and the recessed further insulator material that forms a lower mold layer 3. The thickness of lower mold layer 3 results primarily from the thickness of sacrificial mold layer 30.

Lower mold layer 3 is further recessed, such that an upper portion of lower backside electrode section 34 is exposed. Then the exposed upper portion of lower backside electrode section 34 is removed.

Figure 3:
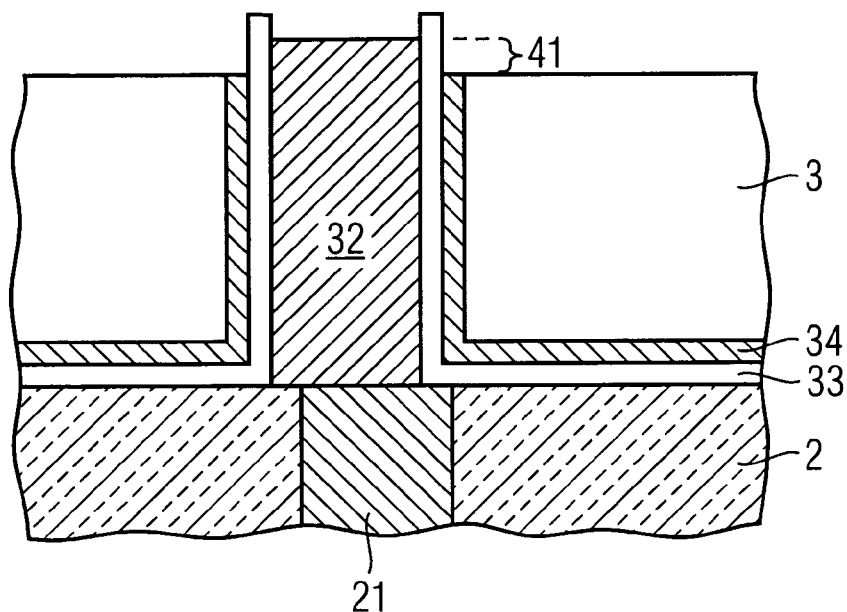

FIG. 3 illustrates lower backside electrode section 34 and lower storage electrode section 32 after the removal of the exposed portion of lower backside electrode section 34. The upper edges of lower mold layer 3 and lower backside electrode section 34 are recessed. The depth of the recess determines a safety distance 41 between the upper edges of the lower sections 32, 34 of the storage electrode and the backside electrode. Safety distance 41 is selected such that in the following a short circuit between the storage electrode and the backside electrode is avoided reliably. The upper edge of lower backside electrode section 34 is provided beneath the upper edge of lower storage electrode section 32, because the lower storage electrode section 32 is recessed from the upper edge, whereas the lower backside electrode section 34 is recessed from the exposed vertical sidewall portion.

An insulator material is deposited. In one embodiment the insulator material is silicon nitride $Si_3N_4$. The deposited insulator material forms an etch control liner 42. The thickness of etch control liner 42 ranges, in one embodiment, from 50 to 200 Nanometers.

Figure 4:
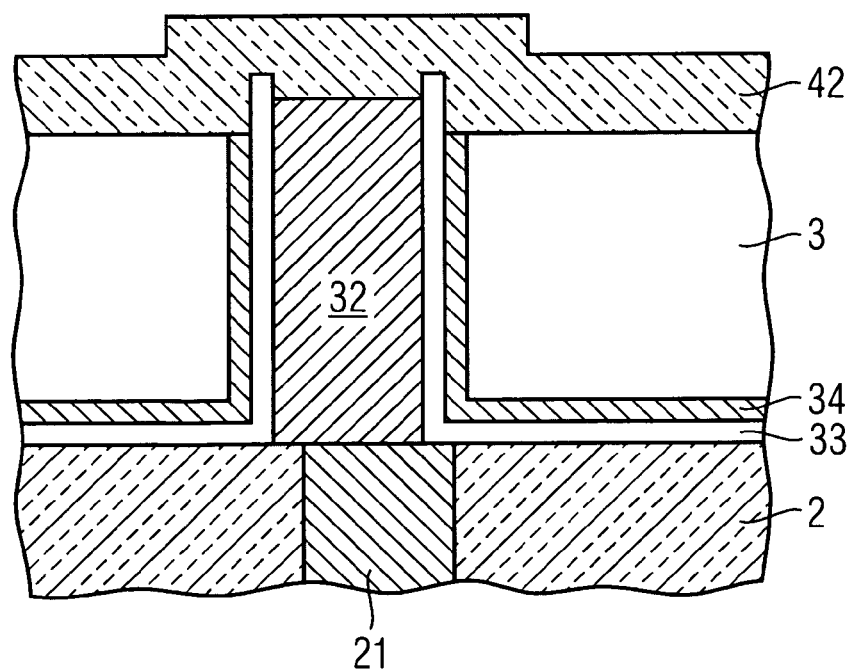

FIG. 4 illustrates etch control liner 42 that covers the recessed lower mold layer 3, the exposed edges of lower backside electrode section 34 and first capacitor dielectric 33 and the lower storage electrode section 32.

An insulator material is deposited and planarized. The planarized deposited insulator material forms an upper mold layer 5. The thickness of the upper mold layer 5 ranges, in one embodiment, from 1000 to 4000 Nanometers. A second opening 51 is etched into upper mold layer 5 and through etch control liner 42 such that lower storage electrode section 32 is exposed at least in part.

Figure 5:
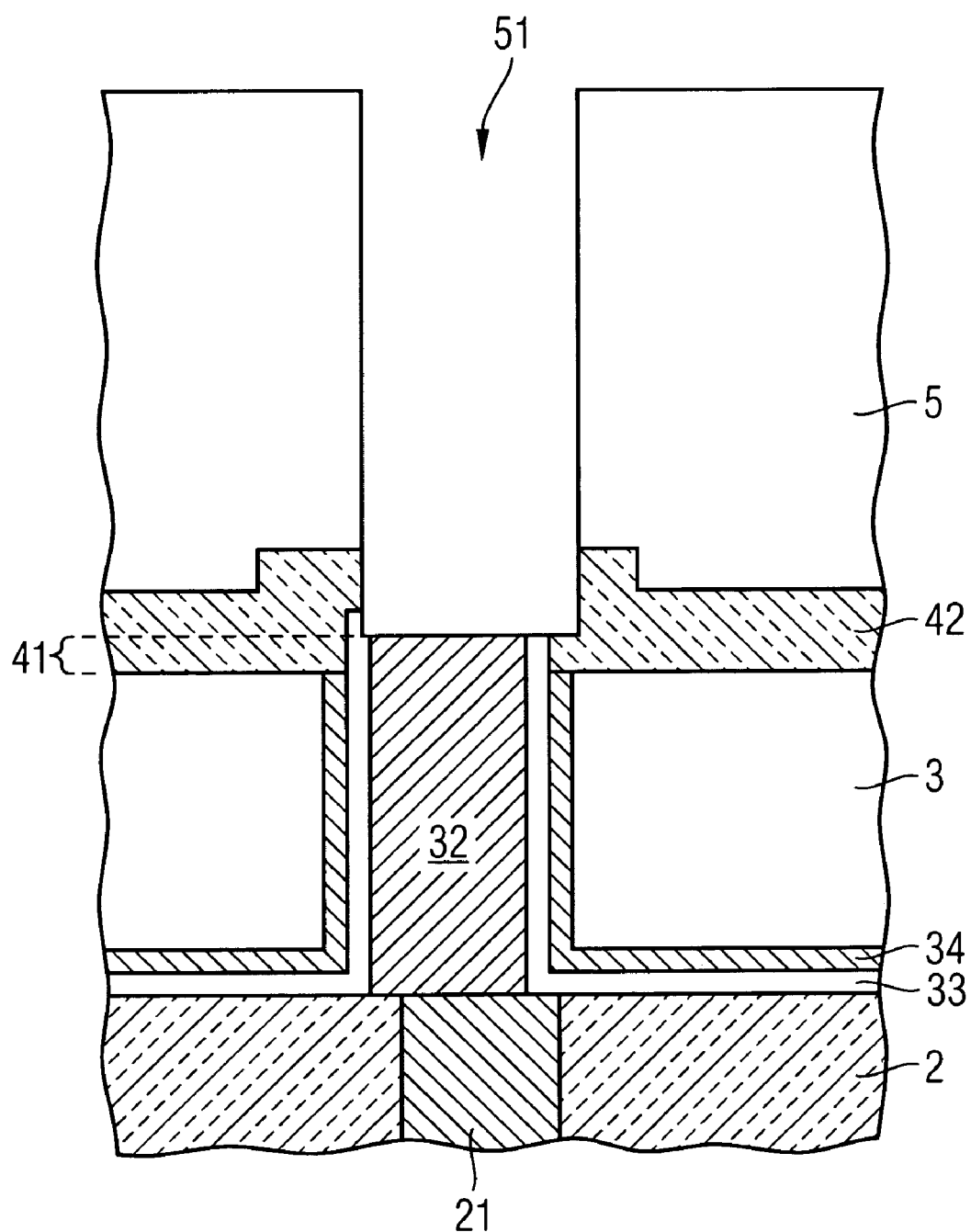

FIG. 5 illustrates second opening 51 in upper mold layer 5. Opening 51 exposes lower storage electrode section 32. Due to safety distance 41, second opening 51 need not be aligned perfectly to lower storage electrode section 32 for to avoid a short circuit with lower backside electrode section 34.

A conductive material, in one embodiment, a metal or a conductive metal compound, is deposited on upper mold layer 5, the exposed sections of lower storage electrode section 32 and etch control liner 42.

Figure 6:
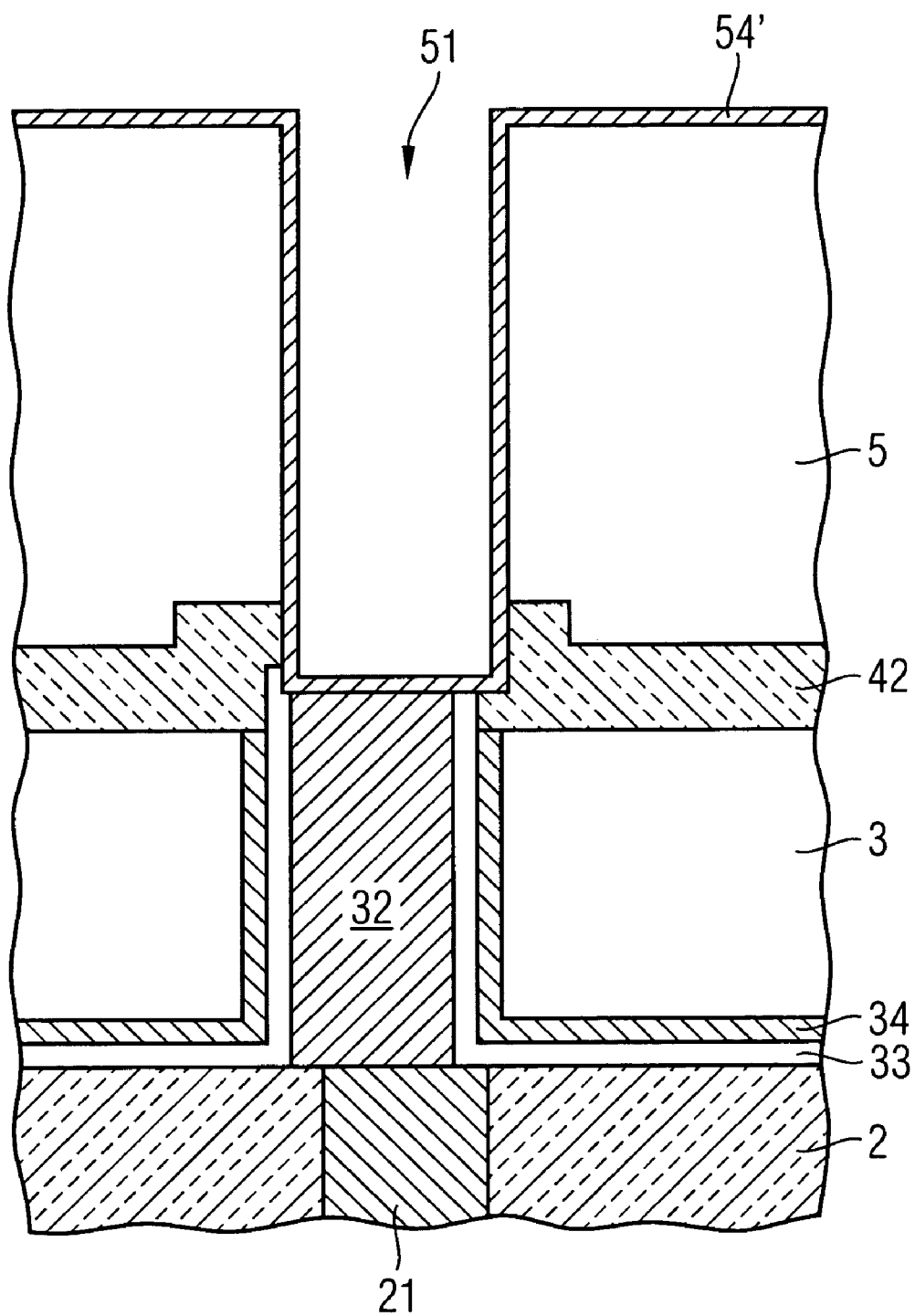

The deposited conductive material forms a conformal conductive layer 54' which is illustrated in FIG. 6.

Conformal conductive layer 54' is recessed and thereby removed from the horizontal surface of upper mold layer 5.

Figure 7:
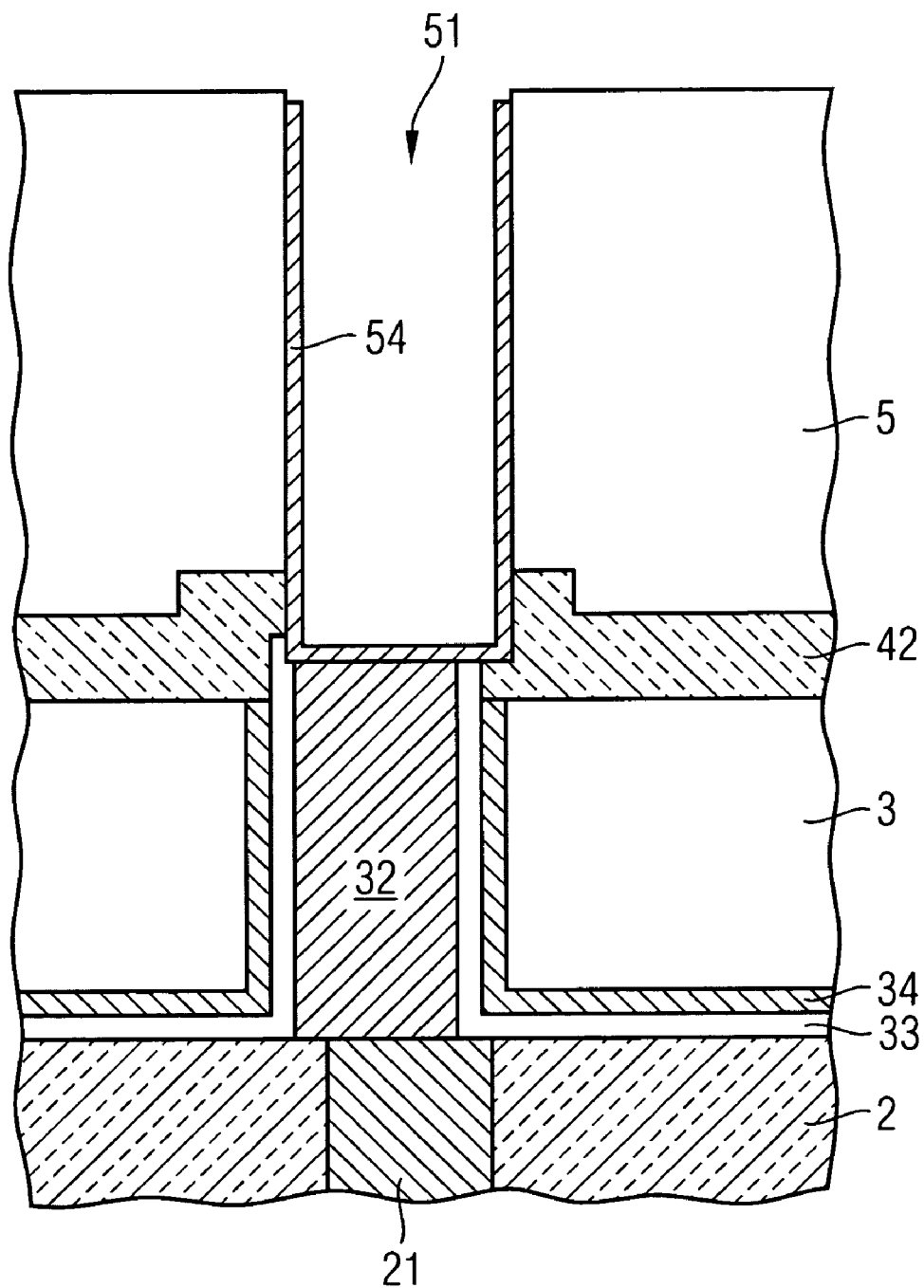

According to FIG. 7, the recessed conformal conductive layer forms an upper storage electrode section 54 that lines second opening 51 and adjoins lower storage electrode section 32. An insulator material is deposited, in one embodiment, by means of an atomic layer deposition process. A conductive layer may be deposited by means of an atomic layer deposition process. A further conductive material is deposited, in one embodiment, in a high deposition rate process.

Figure 8:
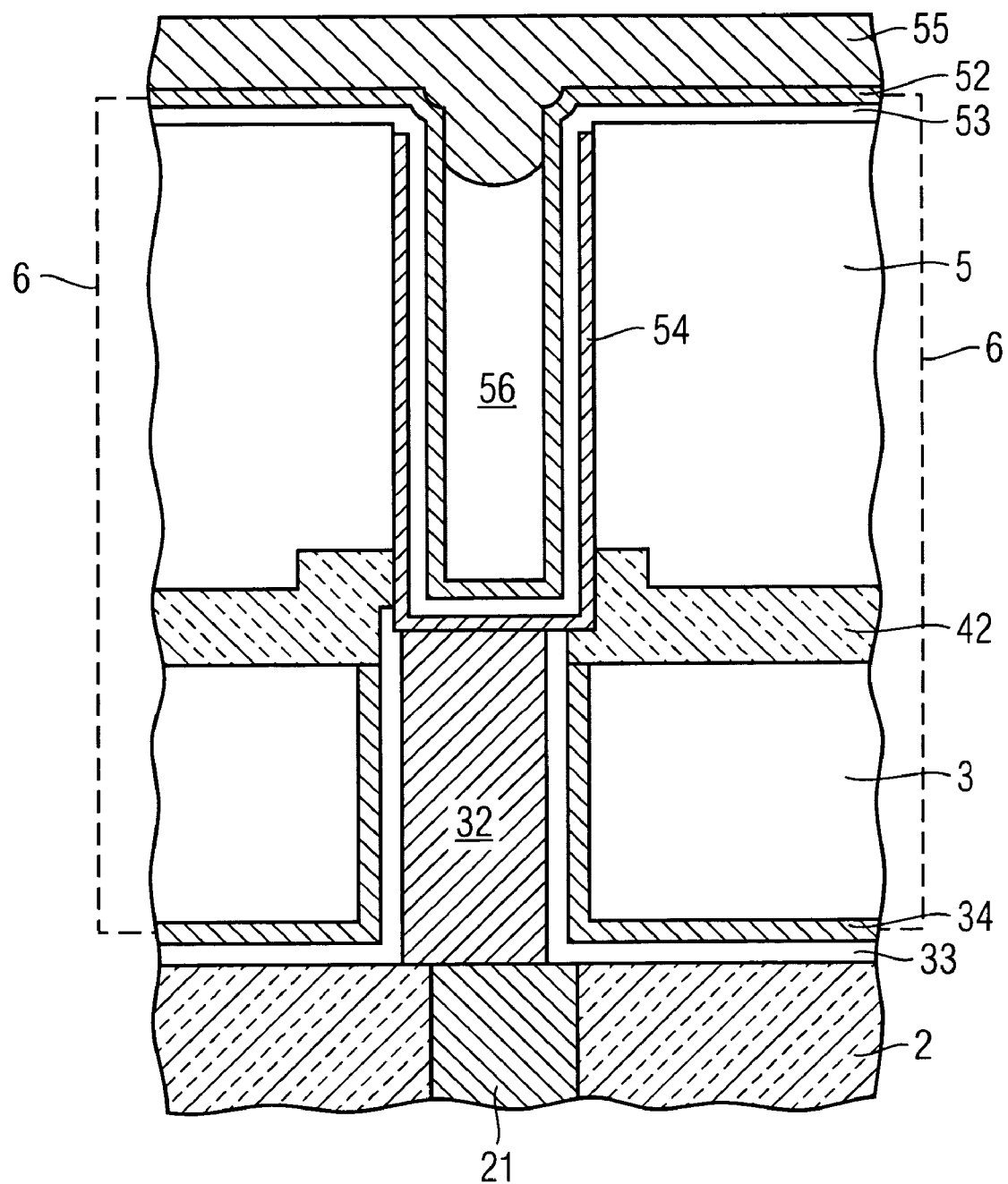

Referring to FIG. 8, the deposited insulator material forms a second capacitor dielectric 53. The material of second capacitor dielectric 53 is, in one embodiment, a high-k material such as HfSiOx or HfAlO. The cup-shaped upper storage electrode section 54 separates second capacitor dielectric 53 and first capacitor dielectric 33. The conformally deposited conductive layer 55 forms an upper section 52 of the backside electrode. The further conductive material, which is, in one embodiment, is deposited by a high deposition rate process, covers second opening 51, but does not necessarily fill second opening 51 completely. A void 56 may remain in the inner space of second opening 51 for to achieve a mechanically more stable electrode structure.

In a distance that is greater than the diameter of second opening 51, either essentially simultaneously to the formation of the capacitor or later, a low resistance backside connection structure 6 is formed. Backside connection structure 6 connects upper backside electrode section 52 and lower backside electrode section 34.

In an array of a plurality of capacitors one single backside connection structure 6 is formed that connects the upper backside electrode sections 52 and the lower backside electrode section 34 of each capacitor of the plurality of capacitors.

Neither first capacitor dielectric 33 nor second capacitor dielectric 53 covers an edge or step within those sections that separate the storage electrode and the backside electrode. Therefore, a high-k material with good electric properties may be deposited as first and second capacitor dielectric 33, 53 at high temperatures.

Lower storage electrode section 32 and upper storage electrode section 54 form the storage electrode (also denominated as storage node electrode, inner electrode or lower electrode in prior art) of a storage capacitor. Lower backside electrode section 34 and upper backside electrode section 52 form the backside electrode (also denominated as counter electrode, outer electrode or cell plate electrode in prior art) of the storage capacitor.

Figure 9:
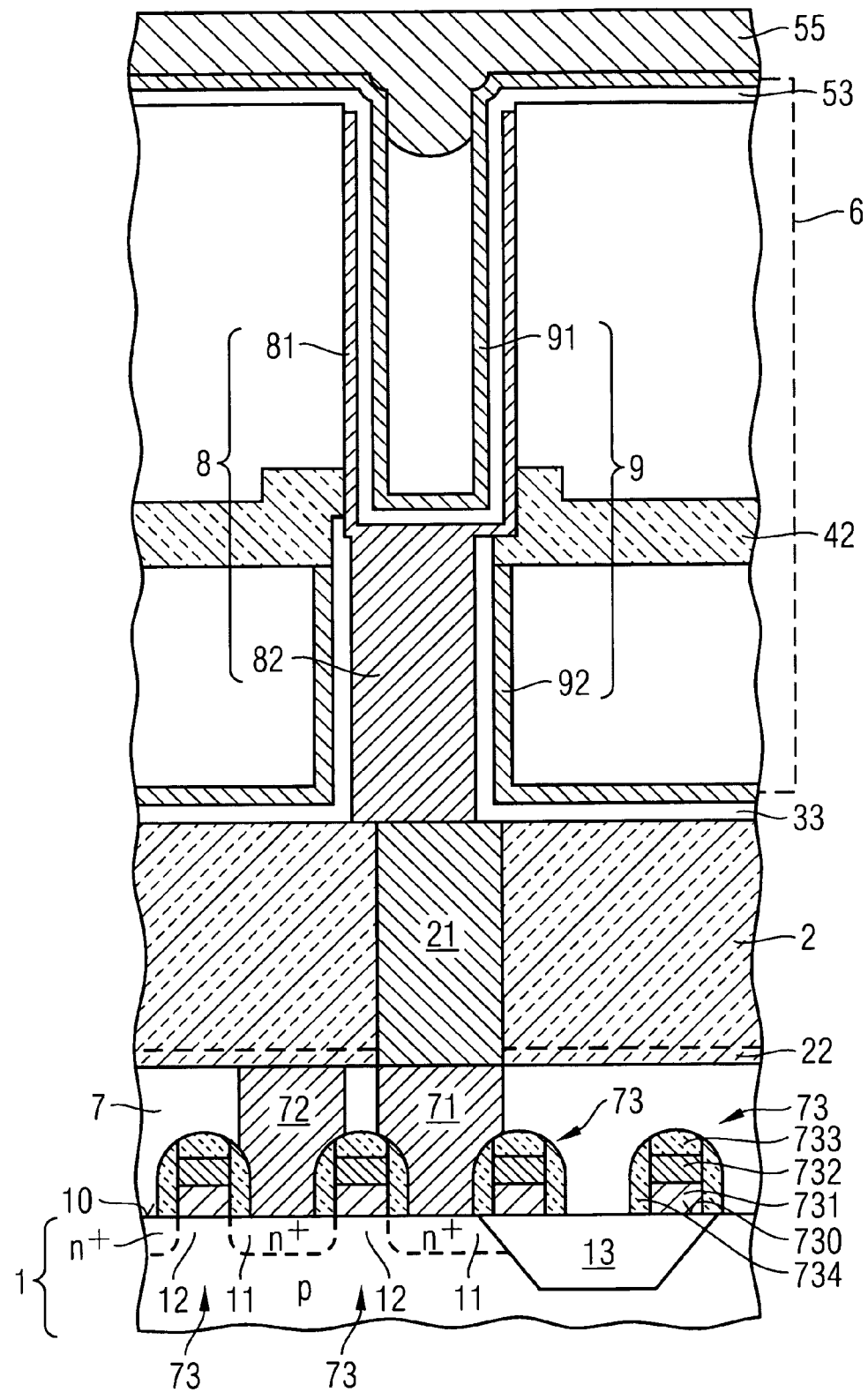
FIG. 9 is a simplified cross-sectional view of a memory cell having a storage capacitor according to another embodiment of the present invention.

FIG. 9 illustrates a dynamic semiconductor memory cell being arranged in an array of identical memory cells. The memory cell comprises a storage capacitor for to store electric charge that represents data and a field effect transistor as access transistor for to access the data stored in the storage capacitor.

Within a singlecrystalline semiconductor substrate 1 an active area of the access transistor is formed. The active area comprises two $n^+$-doped source/drain regions 11 and a channel region 12 separating the two source/drain regions 11. Source/drain regions 11 and channel region 12 may be arranged in various ways. In this embodiment, they are arranged adjacent to a substrate surface 10 of semiconductor substrate 1.

Above channel region 12 a gate electrode is provided as part of a word line 73 that extends on the substrate surface 10 and connects the gate electrodes of a plurality of access transistors. A gate dielectric 730 separates channel region 12 from a gate conductor layer 731 of word line 73. A high conductivity layer 732 covers gate conductor layer 731. A gate cap layer 733 is disposed on high conductivity layer 732. Gate spacers 734 cover the vertical sidewalls of word line 73. Gate conductor layer 731 is made of polysilicon. The material of high conductivity layer 732 is a metal or a metal compound. The material of gate cap layer 733 and gate spacers 734 is an insulator material respectively, in one embodiment, silicon nitride $Si_3N_4$ in both cases.

Shallow trench isolations 13 are provided within substrate 1. The shallow trench isolations 13 separate the active areas of adjacent access transistors in the memory cell array.

A word line interlayer dielectric 7 covers word lines 73 and substrate 1. Word line interlayer dielectric 7 is, in one embodiment, made of a silicon oxide, for example BSG or BPSG. A node contact 71 is formed within word line interlayer dielectric 7 and is connected to a first source/drain region 11 of the access transistor.

A bit line contact 72 is formed in word line interlayer dielectric 7 adjacent to a second source/drain region 11. Bit line contact 72 connects bit line 22 to a second source/drain region 11. Bit line 22 is formed above word line interlayer dielectric 7. An interlayer dielectric 2 covers word line interlayer dielectric 7 and bit lines 22. A node pad 21 is formed in interlayer dielectric 2 and adjacent to node contact 71. Bit line 22 is formed in a plane behind or before the sectional plane and is illustrated by a dashed line.

On top of nod pads 21 a storage capacitor is placed respectively. The storage capacitors comprise a storage electrode 8 and a backside electrode 9 respectively. A first capacitor dielectric 33 separates a lower storage electrode section 82 and a lower backside electrode section 92 respectively. A second capacitor dielectric 53 separates an upper storage electrode section 81 and an upper backside electrode section 91 respectively.

The upper backside electrode sections 91 of a plurality of storage capacitors arranged in the memory cell array are sections of the same conductive layer and are electrically connected to each other. The lower backside electrode sections 92 of a plurality of storage capacitors arranged in the memory cell array are sections of another single conductive layer and are electrically connected to each other.

One single backside connection structure 6, illustrated schematically by a dashed line, connects upper backside electrode sections 91 and lower backside electrode sections 92 of each capacitor within the array of memory cells.

Figure 10:
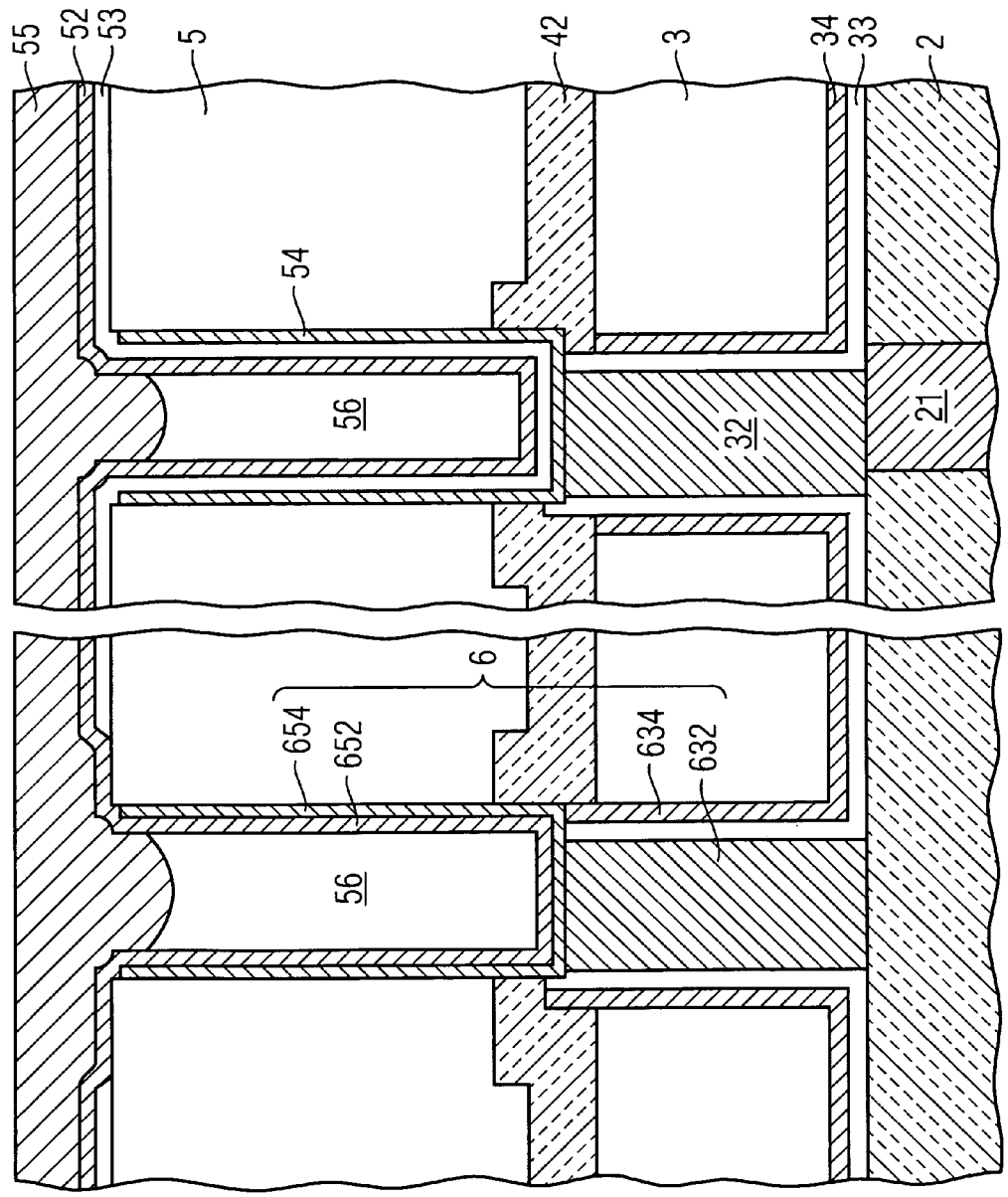
FIG. 10 is a simplified cross-sectional view of a memory cell having at least one storage capacitor and a backside connection structure according to further embodiment of the present invention.

FIG. 10 illustrates one storage capacitor of a plurality of storage capacitors of a memory cell array and a backside connection structure 6 according to a further embodiment of the invention.

The backside connection structure 6 is placed in a distance to storage electrode 9 of the nearest storage capacitor that is greater than the diameter of an upper storage electrode section 81. The distance is such that backside electrode structure 6 does not contribute significantly to the capacity of the storage capacitor and that upper storage electrode section 54 is to be regarded as single-sided electrode.

Backside connection structure 6 may be formed at least in sections according to and contemporaneously with the electrodes of the storage capacitor. In this case, a lower contact opening may be formed in the lower mold layer 3 contemporaneously with the formation of the first opening 31. A pad-shaped first lower contact section 632 of backside connection structure 6 is formed within the lower contact opening according to and contemporaneously with lower pad-shaped storage electrode section 32. Then a section of the layer that forms the lower backside electrode section 34 forms a second lower contact section 634 of backside electrode structure 6, such that lower backside electrode section 34 is electrically connected to the backside connection structure 6. During the recess of lower mold layer 3 and/or lower backside electrode section 34, the lower contact section 634 is masked.

An upper contact opening may be formed in the upper mold layer 5 contemporaneously with the formation of the upper opening 51 such that both first lower contact section 632 and second lower contact section 634 are exposed in sections. A cup-shaped first upper contact section 654 of backside connection structure 6 is formed according to and simultaneously with upper storage electrode section 54. Due to a misalignment of first and second opening or a greater diameter of the second opening, the cup-shaped first upper contact section 654 adjoins the second lower contact section 634. The conformal dielectric layer which forms second capacitor dielectric 53 is removed from first upper contact section 634 before the further conformal conductive layer forming the upper storage electrode section 52 is deposited. The further conformal conductive layer forms a second upper contact section 652 of backside connection structure 6 and connects the upper backside electrode section 52 to backside connection structure 6.

Backside connection structure 6 has a pad-shaped lower contact section 632, 634 with an upper edge that is flush to the upper edge of pad-shaped lower storage electrode section 32 of the storage capacitor.

Alternatively, backside connection structure 6 may be formed according to and contemporaneously with further contact structures that connect first conductive structures being formed in substrate 1 with second conductive structures being disposed above upper mold layer 5.

In this case, a one-step etch may be performed to form a contiguous contact opening through a flat section of upper backside electrode section 52, upper mold layer 5, etch control liner 42, and lower mold layer 3 such that lower backside electrode section 34 is exposed in a flat section. The etch may stop on the flat section of lower backside electrode section 34 or on interlayer dielectric 2. A conductive material is deposited and fills the contiguous contact opening, wherein the backside connection structure 6 is formed within the contiguous contact opening The cross-section of backside connection structure 6 may be a circle or an ellipse in each section plane. The diameter of backside connection structure 6 is, in one embodiment, 50 to 1000 Nanometers.

As only one backside connection structure 6 is provided for a plurality of storage capacitors, the diameter may be significantly greater than that of a storage electrode.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A dynamic semiconductor memory cell comprising:
   a storage capacitor comprising:
      a storage electrode having a pad-shaped lower section and a cup-shaped upper section, wherein the upper section is situated on top of the lower section;
      a lower section of a backside electrode encloses the pad-shaped section of the storage electrode;
      an upper section of the backside electrode is enclosed by the cup-shaped upper section of the storage electrode, wherein an upper edge of the lower backside electrode section is provided below an upper edge of the lower storage electrode section;
      a first capacitor dielectric separating the lower sections of the backside and the storage electrodes; and
      a second capacitor dielectric separating the upper sections of the backside and the storage electrodes, wherein the first and second capacitor dielectrics are separated from each other.

2. A capacitor for a dynamic semiconductor memory cell comprising:
   means for providing a storage electrode, the storage electrode means comprising a pad-shaped lower storage electrode section and a cup-shaped upper storage electrode section, the upper storage electrode being placed on top of the lower storage electrode section;
   means for providing a backside electrode, the backside electrode means comprising a lower backside electrode section and an upper backside electrode section, the lower backside electrode section forming a hollow cylinder enclosing the lower storage electrode section and the upper backside electrode section being enclosed by the cup-shaped upper storage electrode section, wherein the upper edge of the lower backside electrode section is provided below the upper edge of the lower storage electrode section;
   a first capacitor dielectric means for separating the lower storage electrode section and the lower backside electrode section; and
   a second capacitor dielectric means for separating the upper storage electrode section and the upper backside electrode section and being separated from the first capacitor dielectric.

3. An integrated circuit including a capacitor comprising:
   a storage electrode, the storage electrode comprising a pad-shaped lower storage electrode section and a cup-shaped upper storage electrode that is situated on top of the lower storage electrode section;
   a backside electrode comprising a lower backside electrode section and an upper backside electrode section, the lower backside electrode section forming a hollow cylinder enclosing the lower storage electrode section and the upper backside electrode section being enclosed by the cup-shaped upper storage electrode section, wherein an upper edge of the lower backside electrode section is provided below an upper edge of the lower storage electrode section;
   a first capacitor dielectric separating the lower storage electrode section and the lower backside electrode section; and
   a second capacitor dielectric separating the upper storage electrode section and the upper backside electrode section, wherein the second capacitor dielectric and the first capacitor dielectric are separated from each other.

4. The integrated circuit of claim 1, wherein the storage electrode separates the first capacitor dielectric and the second capacitor dielectric.

5. The integrated circuit of claim 1, wherein the cross-section of the cup-shaped upper storage electrode section is a circular or oval ring.

6. The integrated circuit of claim 1, wherein the cross-section of the pad-shaped lower storage electrode section is a circle or an ellipse.

7. The integrated circuit of claim 1, wherein the lower backside electrode section and the upper backside electrode section in each case further comprise flat sections, the flat sections extending orthogonally to a longitudinal axis of the lower storage electrode section.

8. The integrated circuit of claim 7, wherein a backside connection structure connects the lower backside electrode section and the upper backside electrode section, the backside connection structure extending between the flat sections of the lower backside electrode section and the upper backside electrode section.

9. The integrated circuit of claim 8, wherein the backside connection structure is located in a distance to the storage electrode that is greater than a half of the diameter of the upper storage electrode section.

10. The integrated circuit of claim 8, wherein the backside connection structure comprises a pad-shaped lower contact portion, the pad-shaped lower contact portion having a circular of oval cross-section.

11. A dynamic random access memory comprising:
    an access transistor; and
    a storage capacitor coupled to the access transistor comprising:
       a storage electrode, the storage electrode comprising a pad-shaped lower storage electrode section and a cup-shaped upper storage electrode section, that is situated on top of the lower storage electrode section;
       a backside electrode comprising a lower backside electrode section and an upper backside electrode section, the lower backside electrode section forming a hollow cylinder enclosing the lower storage electrode section and the upper backside electrode section being enclosed by the cup-shaped upper storage electrode section, wherein the upper edge of the lower backside electrode section is provided below the upper edge of the lower storage electrode section a first capacitor dielectric adjacent to the lower storage electrode section; and a second capacitor dielectric separating the upper storage electrode section and the upper backside electrode section, and the storage electrode separating the second capacitor dielectric from the first capacitor dielectric.

12. The memory of claim 11, wherein the cross-section of the cup-shaped upper storage electrode section is a circular or oval ring.

13. The memory of claim 11, wherein the cross-section of the pad-shaped lower storage electrode section is a circle or an ellipse.

14. The memory of claim 11, wherein the lower backside electrode section and the upper backside electrode section in each case further comprise flat sections, the flat sections extending orthogonally to a longitudinal axis of the lower storage electrode section, wherein a backside connection structure connects the lower backside electrode section and the upper backside electrode section, the backside connection structure extending between the flat sections of the lower backside electrode section and the upper backside electrode section.

15. The memory of claim 14, wherein the backside connection structure is located in a distance to the storage electrode that is greater than a half of the diameter of the upper storage electrode section.

16. The memory of claim 14, wherein the backside connection structure comprises a pad-shaped lower contact portion, the pad-shaped lower contact portion having a circular of oval cross-section.

17. An integrated circuit including a capacitor comprising:
a storage electrode, the storage electrode comprising a pad-shaped lower storage electrode section and a cup-shaped upper storage electrode that is situated on top of the lower storage electrode section;
a backside electrode comprising a lower backside electrode section and an upper backside electrode section, the lower backside electrode section forming a hollow cylinder enclosing the lower storage electrode section and the upper backside electrode section being enclosed by the cup-shaped upper storage electrode section, wherein the lower backside electrode section and the upper backside electrode section in each case further comprise flat sections, the flat sections extending orthogonally to a longitudinal axis of the lower storage electrode section;
a first capacitor dielectric separating the lower storage electrode section and the lower backside electrode section;
a second capacitor dielectric separating the upper storage electrode section and the upper backside electrode section, wherein the second capacitor dielectric and the first capacitor dielectric are separated from each other; and
a backside connection structure connecting the lower backside electrode section and the upper backside electrode section, the backside connection structure extending between the flat sections of the lower backside electrode section and the upper backside electrode section.

18. The integrated circuit of claim 17, wherein the upper edge of the lower backside electrode section is provided below the upper edge of the lower storage electrode section.

19. A dynamic random access memory comprising:
an access transistor; and
a storage capacitor coupled to the access transistor comprising:
a storage electrode, the storage electrode comprising a pad-shaped lower storage electrode section and a cup-shaped upper storage electrode section, that is situated on top of the lower storage electrode section;
a backside electrode comprising a lower backside electrode section and an upper backside electrode section, the lower backside electrode section forming a hollow cylinder enclosing the lower storage electrode section and the upper backside electrode section being enclosed by the cup-shaped upper storage electrode section, wherein the lower backside electrode section and the upper backside electrode section in each case further comprise flat sections, the flat sections extending orthogonally to a longitudinal axis of the lower storage electrode section;
a first capacitor dielectric adjacent to the lower storage electrode section;
a second capacitor dielectric separating the upper storage electrode section and the upper backside electrode section, and the storage electrode separating the second capacitor dielectric from the first capacitor dielectric; and
a backside connection structure connecting the lower backside electrode section and the upper backside electrode section, the backside connection structure extending between the flat sections of the lower backside electrode section and the upper backside electrode section.

20. The memory of claim 19, wherein the upper edge of the lower backside electrode section is provided below the upper edge of the lower storage electrode section.

* * * * *